(12) United States Patent
Cowley et al.

(10) Patent No.: US 9,018,975 B2
(45) Date of Patent: Apr. 28, 2015

(54) METHODS AND SYSTEMS TO STRESS-PROGRAM AN INTEGRATED CIRCUIT

(71) Applicant: Intel Corporation, Santa Clara, CA (US)

(72) Inventors: Nicholas P. Cowley, Wiltshire (GB); Ramnarayanan Muthukaruppan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 13/768,411

(22) Filed: Feb. 15, 2013

(65) Prior Publication Data

US 2014/0232430 A1 Aug. 21, 2014

(51) Int. Cl.
*H03K 19/173* (2006.01)
*G11C 17/18* (2006.01)

(52) U.S. Cl.
CPC ................................... *H03K 19/173* (2013.01)

(58) Field of Classification Search
USPC ................... 326/38–41; 365/96, 149, 189.05, 365/198.11, 189.14, 203, 205, 207, 208, 365/225.7
See application file for complete search history.

(56) References Cited

U.S. PATENT DOCUMENTS

| | | | |
|---|---|---|---|
| 4,634,905 A | 1/1987 | Campbell, Jr. | |
| 5,455,931 A * | 10/1995 | Camporese et al. | 713/501 |
| 5,650,971 A * | 7/1997 | Longway et al. | 365/207 |
| 6,462,998 B1 * | 10/2002 | Proebsting | 365/205 |
| 6,906,962 B2 | 6/2005 | Layman et al. | |
| 7,402,855 B2 * | 7/2008 | Kurjanowicz | 257/288 |
| 7,508,694 B2 * | 3/2009 | Terzioglu et al. | 365/96 |
| 7,688,648 B2 * | 3/2010 | Kim | 365/189.14 |
| 7,759,970 B2 * | 7/2010 | Terzioglu et al. | 326/38 |
| 8,179,160 B1 | 5/2012 | Chauhan et al. | |
| 8,334,715 B1 | 12/2012 | Muthali et al. | |
| 2006/0061388 A1 | 3/2006 | Kuang et al. | |
| 2006/0238266 A1 | 10/2006 | Harjani et al. | |
| 2008/0250290 A1 | 10/2008 | Bushard et al. | |

FOREIGN PATENT DOCUMENTS

| | | |
|---|---|---|
| JP | 2005-065044 A | 3/2005 |
| WO | 2014/127358 A1 | 8/2014 |

OTHER PUBLICATIONS

Liang et al., "Mitigating the Impact of Process Variations on Processor Register Files and Execution Units", 39th Annual IEEE/ACM International Symposium on Microarchitecture, Dec. 9-13, 2006, 11 pages.

(Continued)

*Primary Examiner* — Vibol Tan
(74) *Attorney, Agent, or Firm* — Garrett IP, LLC

(57) ABSTRACT

Methods and systems to stress-program a first integrated circuit (IC) block to output a pre-determined value upon activation/reset, such as to support time-zero compensation/trimming. To program, the first block is configured with first-block program parameters to cause the first block to output a pre-determined value. The first block is stressed while configured with the first-block program parameters, to cause the first block to output the pre-determined value without the first-block program parameters. The first block may include a latch designed as a fully balance circuit and may be asymmetrically stressed to alter a characteristic of one path relative to another. The pre-determined value may be selected to compensate for process corner variations and/or other random variations.

28 Claims, 11 Drawing Sheets

(56) References Cited

OTHER PUBLICATIONS

Mathew et al., "Hardware-Embedded Key Based on Random Variations of a Stress-Hardened Inegrated Circuit", U.S. Appl. No. 13/889,849, filed on May 8, 2013, 55 pages.

International Search Report and Written Opinion received for PCT Patent Application No. PCT/US2014/016904, mailed on Jun. 19, 2014, 11 pages.

* cited by examiner

METHODS AND SYSTEMS TO STRESS-PROGRAM AN INTEGRATED CIRCUIT

BACKGROUND

Process corners may vary amongst wafers from which integrated circuit (IC) dies are cut, amongst IC dies cut from the same wafer, and/or within a particular one of the IC dies. Process corner variations may adversely impact timing and/or other characteristics of an IC.

In an IC die that includes multiple discernible IC blocks, such as in a system-on-a-chip (SoC), an IC block may be adversely impacted by random variations caused by other IC blocks.

Compensation for process corner variations and/or other random variations may be provided with an on-die programmable fuse array, programmed based on results of a high volume manufacturing (HVM) tests. A fuse array may necessitate additional pins for addressing, and may necessitate a special addressing scheme to accommodate security concerns.

Compensation for process corner variations and/or other random variations may also be provided with an on-die trim or calibration system.

Programmed fuse data may not be available until after commencement of a boot sequence. Similarly, data from an on-die trim or calibration system may not be available for some time following power-up. Where process adjustment compensation is desired upon activation or power-up (i.e., at time-zero), an IC die or IC block may be over-designed to avoid adverse impacts of process variations and/or other random variations.

BRIEF DESCRIPTION OF THE DRAWINGS

One or more features are described herein with reference to one or more of the following drawings, for illustrative purposes. Feature(s) described herein with respect to the following drawings are not, however, limited to the examples illustrated in the drawings.

Figure 1:
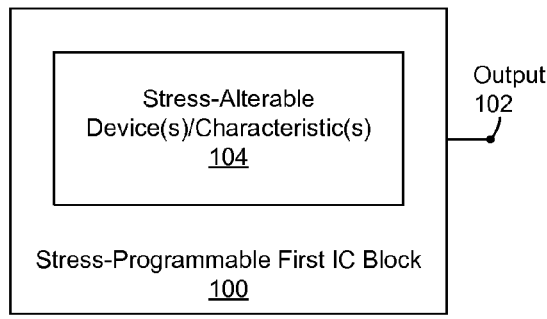
FIG. 1 is a block diagram of an integrated circuit (IC) block that is stress-programmable to output a pre-determined value upon activation.

In the drawings, the leftmost digit(s) of a reference number identifies the drawing in which the reference number first appears.

DETAILED DESCRIPTION

Digital electronic circuits utilize multiple discrete states, each of which is associated with a corresponding discrete band, range, or envelope of analog values (e.g., voltages). Any value within an envelope represents the associated state. Relatively small changes to an analog value (e.g., due to manufacturing tolerance, signal attenuation or parasitic noise), may be ignored by signal state sensing circuitry, provided that the analog value remains within the corresponding discrete envelope.

A binary digital system has two permitted states, represented by corresponding voltage bands. A first voltage band may include a voltage reference (e.g., ground), denoted herein as Vss. A second voltage band may include a supply voltage, denoted herein as Vcc. The first and second voltage bands may be associated with logic states of 0 and 1, respectively.

The term "complimentary logic states," as used herein, refers to set of permitted or allowable states. In a binary digital system, complementary logic states include two logic states, denoted herein as logic states 0 and 1, also referred to herein as opposing logic states.

The term "complementary outputs," as used herein, refers to outputs to present or assert complementary logic states relative to one another. In a binary digital system, complementary outputs include first and second outputs to assert opposing logic states.

The term "complementary nodes," as used herein, refers to nodes to present or assert complementary logic states relative to one another. In a binary digital system, complementary nodes include first and second nodes to assert opposing logic states.

The term "complementary paths," as used herein, refers to circuit paths to process complementary logic states relative to one another. In a binary digital system, complementary paths include first and second paths to process opposing logic states.

FIG. 1 is a block diagram of a first integrated circuit (IC) block 100 that is stress-programmable to alter a device and/or characteristic (characteristic) 104 of IC block 100, to cause IC block 100 to assert a pre-determined value at an output 102 upon activation.

Activation may include application of an operating voltage, assertion of an enable control, and/or de-assertion or de-activation of a reset control. A time associated with activation is referred to herein as time-zero, and the pre-determined value may be referred as a pre-determined time-zero value.

Output 102 may include one or more bits to output the pre-determined value as a pre-determined logic state or a pre-determined word value.

First IC block 100 may be designed and/or manufactured to assert a random value at output 102 upon activation. Prior to stress-programming, first IC block 100 may be referred to as a metastable IC block, and output 102 may be referred to as a metastable output.

First IC block 100 may be designed and/or manufactured as a fully balanced circuit. First IC block 100 may include, for example, first and second paths designed and/or manufactured to have similar or identical characteristics. First IC block 100 is not, however, limited to these examples. First IC block 100 may be configured as a programmable configuration register to provide a stress-programmable configuration register value at time-zero, such as to enable or support process-compensation adjustment at time-zero. First IC block 100 is not, however, limited to these examples.

First IC block 100 may be stress-programmed as described below with reference to FIG. 2.

Figure 2:
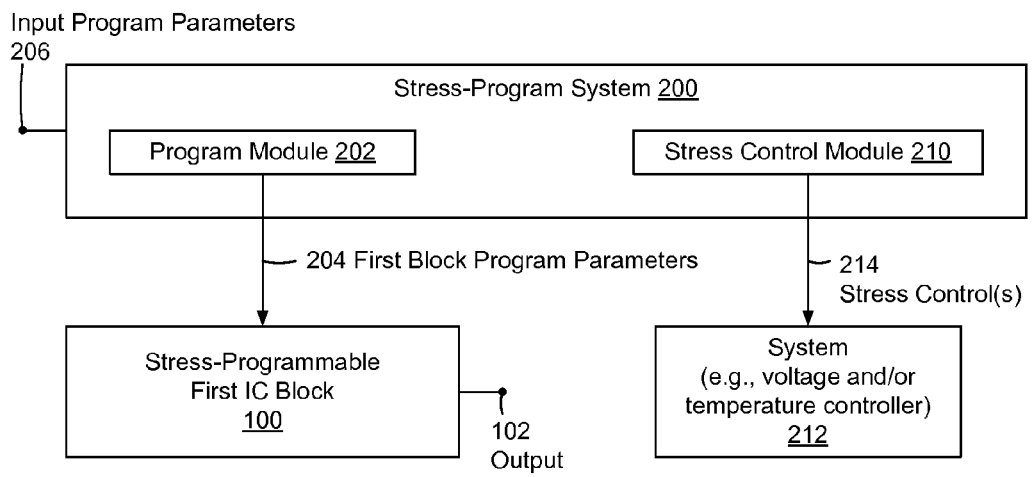
FIG. 2 is a block diagram of a stress-program system, including a program module to program or configure an IC block with program parameters to output a pre-determined value, and a stress control module to stress the first IC block while the program parameters are applied.

FIG. 2 is a block diagram of a stress-program system 200, including a program module 202 to program or configure first IC block 100 with first block program parameters 204 to cause first IC block 100 to output a pre-determined value at output 102. First block program parameters 204 may include data to be applied to an input(s) of first IC block 100, and/or a bias or other configuration control.

First block program parameters 204 may be based on input program parameters 206, which may be determined and/or selected as described below with reference to FIG. 5.

Stress-program system 200 further includes a stress control module 210 to apply and/or control a stress condition while first IC block is programmed or configured to output the pre-determined value. The stress condition may include voltage stress, temperature stress, and/or other stress condition(s). Stress control module 210 may be configured to apply and/or control the stress condition with stress control(s) 214. In the example of FIG. 2, stress control(s) 214 are provided to a system 212, which may include, for example, a voltage controller, a temperature controller, and/or other controller.

Figure 3:
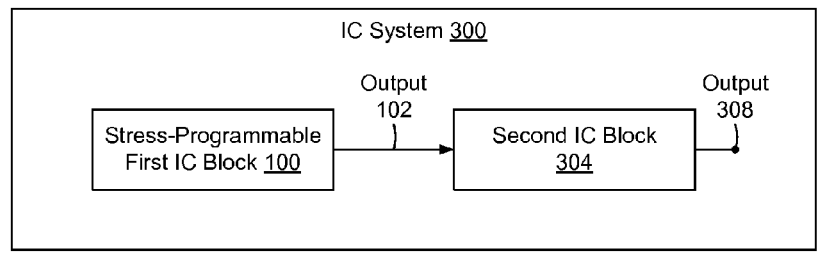
FIG. 3 is a block diagram of an IC system that includes a stress-programmable first IC block and a second IC block to receive a stress-programmed pre-determined value from the first IC block.

FIG. 3 is a block diagram of an IC system 300, including stress-programmable first IC block 100 to provide a stress-programmable pre-determined value to a second IC block 304 upon activation. IC system 300 may be implemented on a single IC die or multiple IC die.

Second IC block 304 may include, for example, compensation circuitry, and first IC block 100 may be stress-programmable to provide a pre-determined configuration register value to second IC block 304 upon activation of first IC block 100, such as upon de-activation or de-assertion of a resent control.

Figure 4:
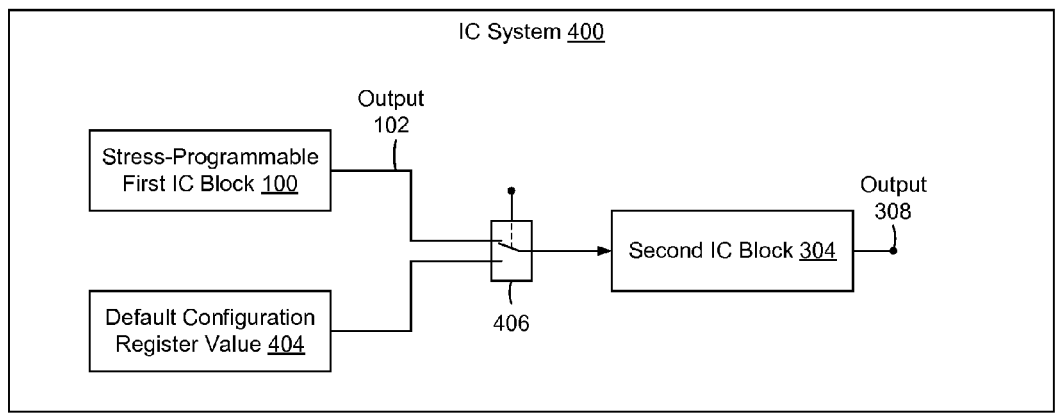
FIG. 4 is a block diagram of another IC system, including features illustrated in FIG. 3, and further including a default configuration register value.

FIG. 4 is a block diagram of an IC system 400, including features described above with reference to FIG. 3, and further including a default configuration register value 404.

IC system 400 may be configurable to provide second IC block 304 with a pre-determined value from output 102 of first IC block 100, or default configuration register value 404, such as with a switch 406. IC system 400 may be configured to provide second IC block 304 with a stress-programmed pre-determined value from output 102 by default.

Default configuration register value 404 may represent a design-based configuration register value, which may be suitable for second IC block 304 absent process corner variations and/or other random variations. Whereas the pre-determined value at output 102 may be based on a post-manufacture evaluation of IC system 400, to compensate for process corner variations and/or other random variations.

A post-manufacture evaluation of IC system 400 may include and/or be performed in conjunction with a HVM test of IC system 400. In the event that evaluation results of IC system 400 indicate that default configuration register value 404 is sufficient, first IC block 100 may be left in an unprogrammed state. Where first IC block 100 is to be stress-programmed, stress programming may be performed as part of, during, and/or in conjunction with a burn-in procedure.

Figure 5:
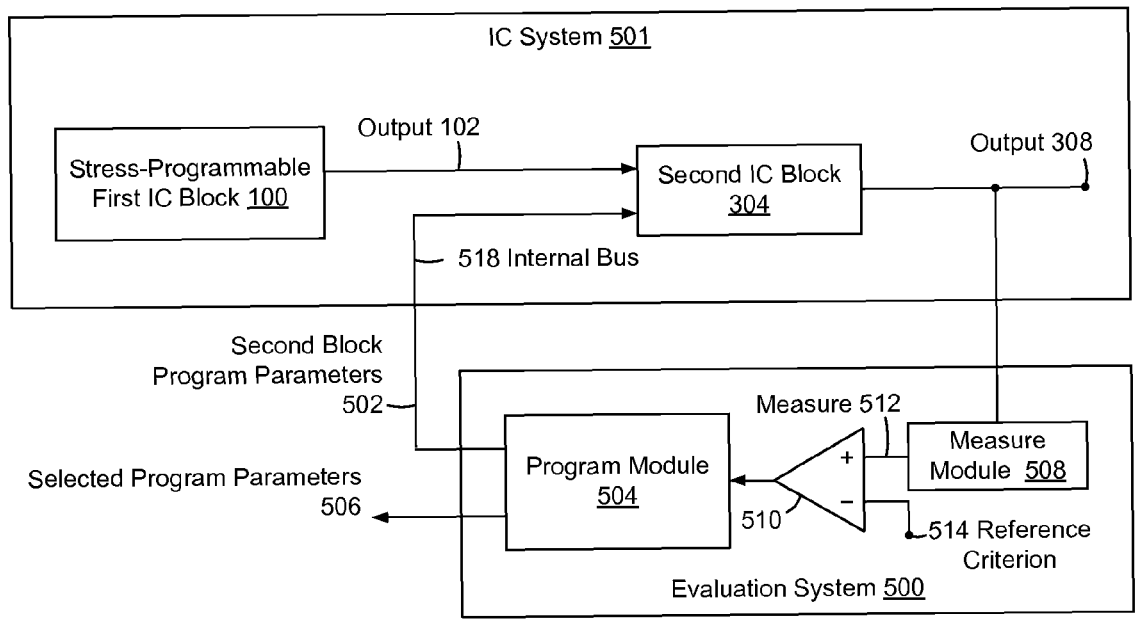
FIG. 5 is a block diagram of an evaluation system to evaluate an IC system.

FIG. 5 is a block diagram of an evaluation system 500 to evaluate an IC system. In FIG. 5, evaluation system 500 is configured to evaluate an IC system 501, illustrated here with features described above with reference to FIG. 3.

Evaluation system 500 includes a program module 504 to program or configure second IC block 304, or a portion thereof, with second block program parameters 502. Second block program parameters 502 may include a logic state or word value to be applied to an input of block 304 during an evaluation.

Evaluation system 500 further includes a measure module 508 to measure a parameter of output 308, and an evaluator module 510 to evaluate a corresponding parameter measure 512 with respect to a reference criterion 514. Reference criterion 514 may include one or more of a value and/or a range or window.

Program module 504 may be configured to select, vary, and/or revise second block program parameters 502 during an evaluation, until a parameter measure 512 corresponds to (i.e., meets or satisfies) reference criterion 514.

When a parameter measure 512 satisfies reference criterion 514, the corresponding second block program parameters 502 may be selected as program parameters 506. Selected program parameters 506 may represent a desired input to be provided to second IC block 304 and, correspondingly, a pre-determined value to be output or asserted by first IC block 100 upon activation. Selected program parameters 506 may correspond to input program parameters 206 in FIG. 2.

IC system 501 may include an internal bus 518, and second IC block 304 may be programmable over internal bus 518. IC system 501 may be configurable to provide second IC block 304 with second block program parameters 502 over internal bus 518 when bus 518 is selected or enabled, and to provide second IC block 304 with a pre-determined value from output 102 of first IC block 100 when bus 518 is de-selected or disabled. A status of bus 518 may be maintained in a register or other storage, which may include a volatile or non-volatile storage device.

IC system 501 may be configured to provide second IC block 304 with a stress-programmed pre-determined value from output 102 upon activation, and to subsequently provide second IC block with an updated value over internal bus 518. The updated value may be determined, for example, by on-die compensation circuitry.

Evaluation system 500 may include and/or may be included within an HVM test system, and/or may be configured to operate in conjunction with an HVM test system.

In FIG. 2, program module 202 may be configured to convert input program parameters 206 to first block program parameters 204 based on a conversion index, such as a lookup table. An example is provided in Table 1 below, for a situation in which first IC block includes two program inputs and two corresponding output bits, and wherein first IC block 100 is configured invert each input at the corresponding output.

TABLE 1

| Input Program Parameters 206 (e.g., pre-determined value to be provided at output 102) | First Block Program Parameters 204 | First Block Output 102 |
|---|---|---|
| 00 | 11 | 00 |
| 01 | 10 | 01 |
| 10 | 01 | 10 |
| 11 | 00 | 11 |

Input program parameters 206 in FIG. 2, or selected program parameters 506 in FIG. 5, may be used to stress-program the same IC system for which the program parameters are selected, and/or to stress-program another similar IC system. For example, program parameters 506 may be selected based on an evaluation of a subset of one or more IC systems within a batch of IC systems, and selected program parameters 506 may thereafter be used to stress-program other IC systems of the batch.

A stress-programmable IC block may include a latch designed and/or manufactured as a fully balanced circuit, such as disclosed in one or more examples below. Methods and systems disclosed herein are not, however, limited to a latch.

Figure 6:
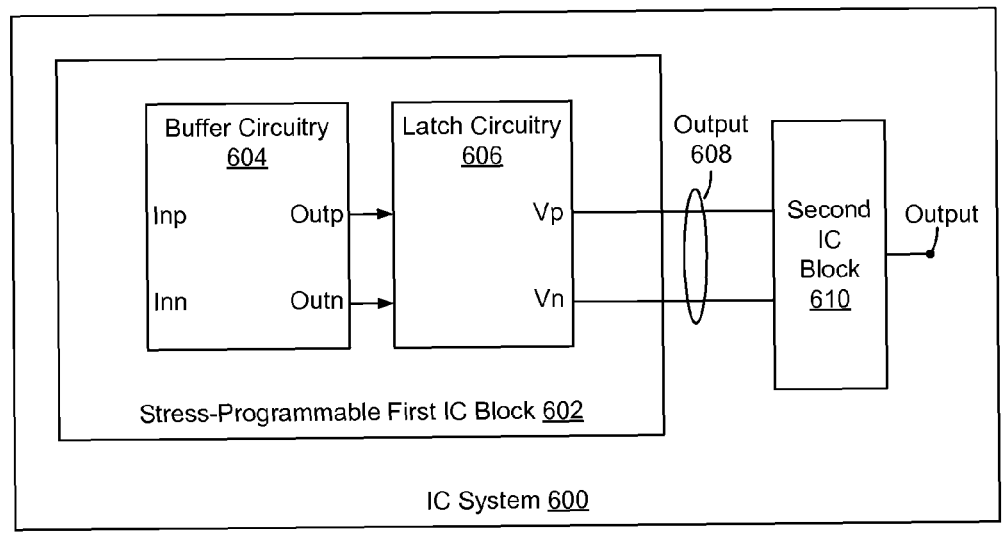
FIG. 6 is a block diagram of another IC system, including a stress-programmable IC block that includes buffer circuitry and latch circuitry, and which may be designed as a fully-balanced circuit.

FIG. 6 is a block diagram of an IC system 600, including a stress-programmable first IC block 602 to provide a pre-determined value at an output 608 at time-zero, and a second IC block 610 to receive the pre-determined value. IC system 600 may represent an example embodiment of IC system 300 in FIG. 3.

First IC block 602 may be designed and/or manufactured as a fully balanced circuit, in which first and second paths are designed to have similar features or characteristics relative to one another.

First IC block 602 includes buffer circuitry 604 having inputs Inp and Inn, and outputs Outp and Outn. Buffer circuit 604 may be configured to assert complementary logic states at outputs Outp and Outn, based on inputs Inp and Inn.

First IC block 602 further includes latch circuitry 606 having inputs to receive complementary outputs Outp and Outn, and corresponding complementary outputs 608, also illustrated here as Vp and Vn.

IC system 600 may be configured to provide one or both of outputs Vp and Vn to second IC block 610.

As a fully balanced circuit, under perfect or ideal manufacturing conditions, there is an equal probability that first IC block 602 will assert logic states of {1,0} or {0,1} at Vp and Vn upon activation. Manufacturing imperfections may impart a bias to first IC block 602, which may cause first IC block 602 to assert {1,0} or {0,1} more often than the other. Nevertheless, upon activation, the asserted value at output 608 may remain effectively unpredictable.

Prior to stress-programming, first IC block 602 may be referred to as a raw or un-programmed memory latch, and/or a metastable latch, and outputs Vp and Vn may be referred to as metastable outputs.

First IC block 602 may be stress-programmable to alter a feature and/or characteristic of one of the first and second paths relative to the other, to cause first IC block 602 to assert a pre-determined value at output 608 upon activation. Latch 602 may be asymmetrically stressed, such as disclosed below with reference to FIG. 7 and/or FIG. 8.

Figure 7:
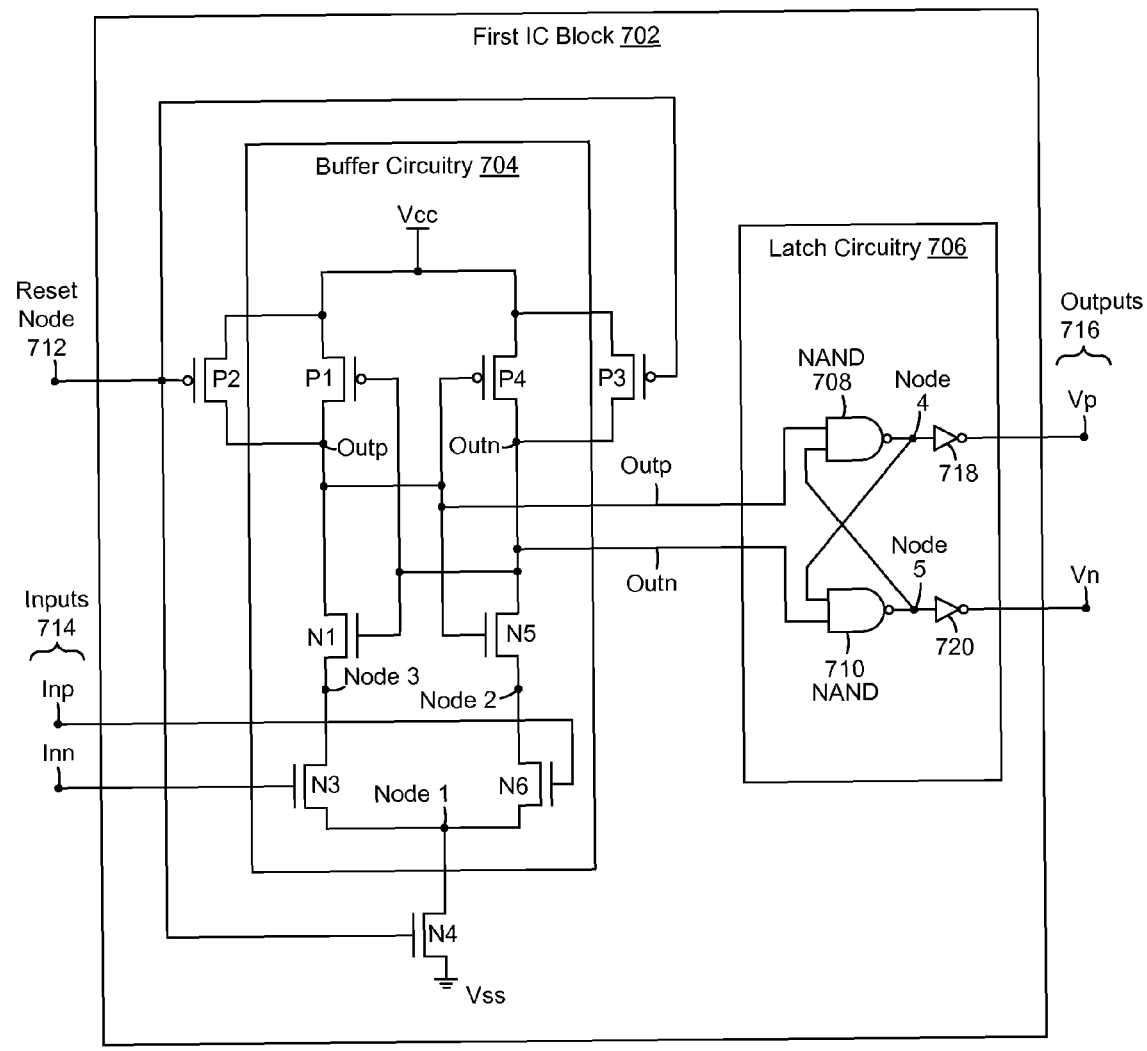
FIG. 7 is a circuit diagram of a stress-programmable IC block, including buffer circuitry, latch circuitry, and reset circuitry.

FIG. 7 is a circuit diagram of a stress-programmable first IC block 702, which may represent an example embodiment of first IC block 602 in FIG. 6.

First IC block 702 includes buffer circuitry 704 having inputs 714, also denoted here as Inp and Inn, and outputs Outp and Outn. First IC block 702 further includes latch circuitry 706 to receive Outp and Outn from buffer circuitry 704, and outputs 716, also denoted here as Vp and Vn.

First IC block 702 may be designed and/or manufactured as a fully differential and/or fully balanced circuit in which first and second paths are designed and/or manufactured to have similar or identical features and/or operational characteristics. In the example of FIG. 7, a first circuit path includes devices N6, N4, P4, NAND logic 708, and an inverter 718. A second circuit path includes devices N3, N1, P1, NAND logic 710, and an inverter 720.

In FIG. 7, outputs Outp and Outn are cross-coupled to control nodes of complementary circuit paths, to control buffer circuitry 704 to assert complementary logic states at outputs Outp and Outn. Specifically, output Outp is coupled to control nodes or gates of devices P4 and N5, and output Outn is coupled to control nodes or gates of devices N1 and P1.

Similarly, nodes 4 and 5 of latch circuitry 706 are cross-coupled to inputs of NAND logic 708 and 710, to control latch circuitry 706 to assert complementary logic states at outputs Vp and Vn.

First IC block 702 further includes reset circuitry, illustrated here as including devices P2, P3, and N4.

First IC block 702 is described below with respect to an operation mode in which reset devices P2 and P3 are off or non-conductive, and device N4 is on or conductive to pull-down node 1 to a reference Vss (e.g., ground). The description below is provided for a situation in which complementary logic states {1,0} are applied to inputs Inp and Inn, respectively (i.e., Inp is pulled-up to an operating voltage Vcc and input Inn is pulled-down to a reference Vss, such as ground).

In buffer circuitry 704, when Inp is pulled-up to an operating voltage Vcc and input Inn is pulled-down to Vss, node 2 is pulled-down to Vss through device N6, output Outn is pulled-down to Vss through devices N5 and N6, and node 3 and output Outp are isolated from Vss. When output Outn is pulled-down, output Outp is pulled-up through device P1, which turns-off device P4 to isolate output Outn from Vcc. Thus, when complementary logic states {1,0} are applied to inputs Inp and Inn, output Outp is pulled-up and output Outn is pulled-down, to assert complementary logic states {1,0} at Outp and Outn, respectively.

In latch circuitry 706, as output Outn is pulled-down, NAND 710 asserts logic 1 at node 5. As output Outp is pulled-up and logic 1 is asserted at node 5, NAND 708 asserts logic 0 at node 4. In this example, where {0,1} is asserted at nodes 4 and 5, latch circuitry 706 asserts complementary logic states {1,0} at outputs Vp and Vn, respectively, through corresponding inverters 718 and 720.

Conversely, when complementary logic states {0,1} are applied to inputs Inp and Inn, buffer circuitry 704 asserts complementary logic states {0,1} at outputs Outp and Outn, and latch circuitry 706 asserts complementary logic states {0,1} at outputs Vp and Vn.

Reset is described below.

When an active-low reset control is asserted at reset node 712, a reset voltage is applied to complementary nodes of first and second paths of buffer circuitry 704. In the example of FIG. 7, when the reset control is active, Vcc is applied to outputs Outp and Outn through devices P2 and P3 apply Vcc, and device N4 is turned-off to isolate buffer circuitry 704 from a reference voltage Vss. Reference voltage Vss may correspond to ground.

Inputs Inp and Inn may be held at Vcc prior to assertion of the reset control, during assertion of the reset control, and/or subsequent to assertion of the reset control. In the example below, inputs Inp and Inn are at Vcc when the reset control is de-activated or de-asserted.

Upon de-activation or de-assertion of the reset control (e.g., upon a rising-edge of the reset control), node 1 is pulled-down towards Vss through device N4. As node 1 is pulled-down, a gate-to-source voltage (Vgs) of device N6 increases. As Vgs of device N6 exceeds a voltage threshold (Vt) of device N6, node 2 is increasingly pulled-down towards Vss through device N6. Similarly, as node 1 is pulled-down, the Vgs of device N3 increases. As the Vgs of device N3 exceeds the Vt of device N3, node 3 is increasingly pulled-down through device N3. If output Outn is pulled-down faster and/or further than output Outp, complementary logic states {1,0} are asserted at outputs 716. Conversely, if output Outp is pulled-down faster and/or further than output Outn, complementary logic states {0,1} are asserted at outputs 716.

As a fully balanced circuit, under perfect or ideal manufacturing conditions, the voltages at nodes 2 and node 3 should fall in tandem with one another to provide an equal probability that {1,0} or {0,1} will be asserted at outputs Vp and Vn following a reset. As described above with reference to FIG. 6, manufacturing imperfections may impart a bias, which may cause first IC block 702 to assert {1,0} or {0,1} more often than the other. Nevertheless, the asserted value at outputs Vp and Vn following a reset may remain effectively unpredictable.

First IC block 702 may be stress-programmable to alter or shift a characteristic of a device in one of the differential paths relative to the characteristic of a corresponding device the other path, to cause latch 702 to assert pre-determined logic states of {1,0} or {0,1} at outputs Vp and Vn upon de-activation of the reset control. An extent of the alteration or shift may depend upon a combination of a stress condition and stress duration.

After stress-programming, first IC block 702 may remain operable to assert complementary logic states at outputs 716 based on complementary logic states applied to inputs 714 when the reset control is inactive.

First and second circuit paths of first IC block 702 may be asymmetrically stressed to alter a characteristic of one of the paths relative to the other. The first and second circuit paths may be asymmetrically stressed to cause a build-up or voltage offset within one or more devices sufficient to cause first IC block 702 to provide a pre-determined value at outputs 716 upon activation.

For example, complementary logic states (i.e., first program parameters) may be asserted at inputs 714 to cause first IC block 702 to assert pre-determined complementary logic states at outputs 716. First IC block 702 may be stressed while the first program parameters are asserted at inputs 714, to alter a characteristic of one of the paths such that first IC block will assert the pre-determined logic states at outputs 716 upon de-activation of the reset control, without assertion of the first program parameters at inputs 714.

First IC block 702 may be asymmetric stressed to alter a Vt of a device in one the paths relative to the Vt of a corresponding device of the other path. The asymmetric stress may be applied, for example, to render the Vt of device N6 lower than the Vt of device N3, to cause buffer circuitry 704 to assert {1,0} at outputs Outp and Outn upon de-activation of the reset control. Conversely, the asymmetric stress may be applied to render the Vt of device N3 lower than the Vt of device N6, to cause buffer circuitry 704 to assert {0,1} at outputs Outp and Outn upon de-activation of the reset control.

An asymmetric stress may include an elevated voltage. For example, an elevated operating voltage (i.e., higher than Vcc), may be applied at least to the first and second paths, or at least to devices N6 and N3, while complementary logic states are asserted at inputs Inp and Inn.

Figure 8:
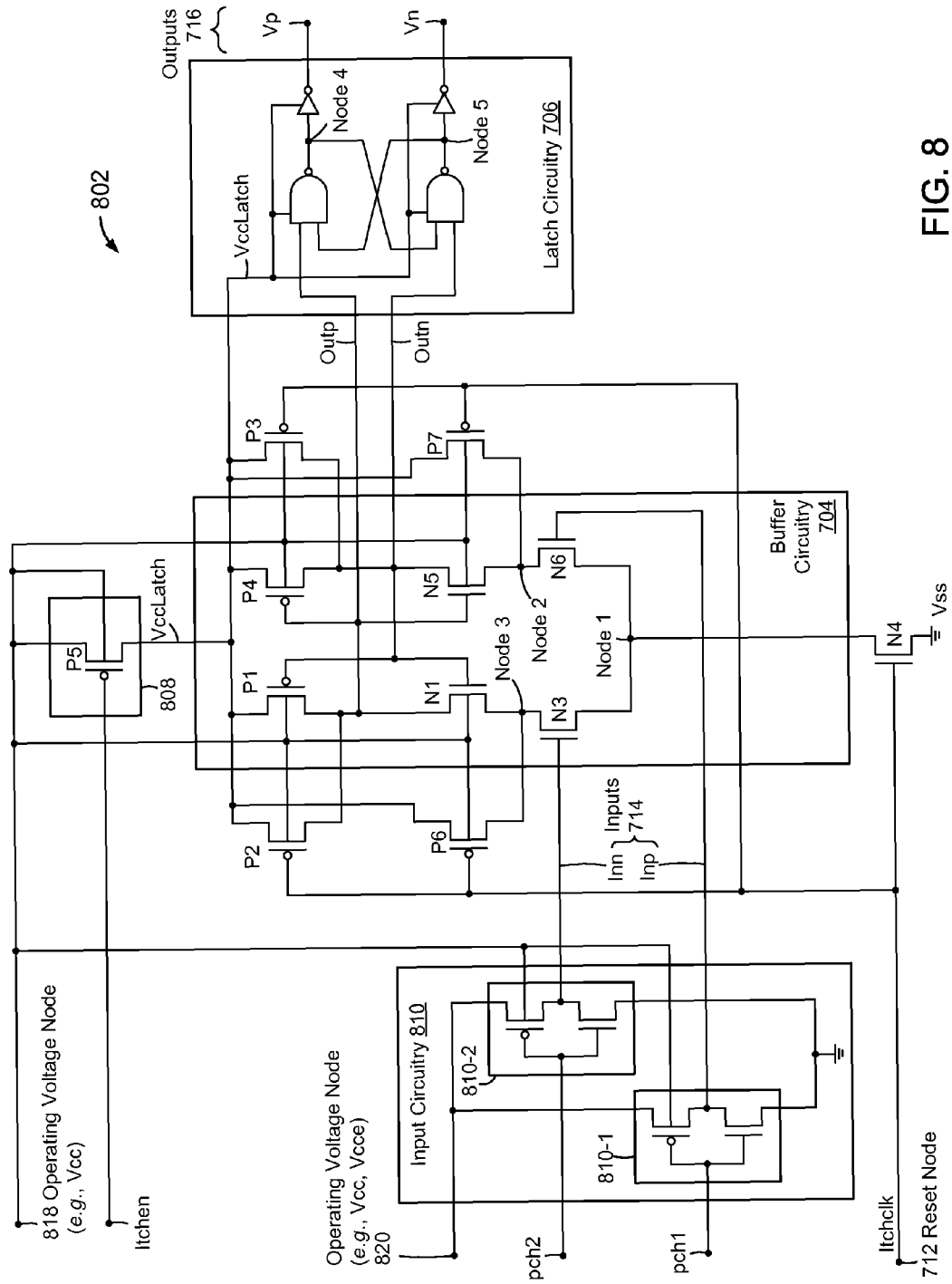
FIG. 8 is another circuit diagram of another stress-programmable IC block, including buffer circuitry, latch circuitry, and reset circuitry.

FIG. 8 is a circuit diagram of a first IC block 802, including features described above with reference to FIG. 7, and further including enable circuitry 808, input circuitry 810, and additional reset circuitry devices P6 and P7.

Enable circuitry 808 includes a device P5 to apply Vcc to buffer circuitry 704 and latch circuitry 706 as VccLatch.

Input circuitry 810 includes inverting input drivers 810-1 and 810-2 to control inputs Inp and Inn based on respective inputs or controls pch1 and pch2.

Further to the description above with respect to reset devices P2, P3, and N4, reset devices P6 and P7 are configured to pull-up nodes 2 and 3 to the reset voltage (e.g., VccLatch), when an active-low reset control Itchclk is asserted at a reset node 712.

To stress-program first IC block 802, complementary logic states, or first block program parameters, are asserted at inputs pch1 and pch2, to cause first IC block 802 to assert pre-determined complementary logic states at outputs 716.

First IC block 802, or a portion thereof, may be stressed while the first block program parameters are asserted at inputs pch1 and pch2, to alter a characteristic of, or to provide an inherent bias to first IC block 802, to cause first IC block 802 to assert the pre-determined complementary logic states at outputs 716 by upon activation, without assertion of the first block program parameters at inputs pch1 and pch2.

The stress may include an elevated operating voltage Vcce (Vcce>Vcc), applied to node 818 and/or node 820. Alternatively, or additionally, the stress may include asserting one of the complementary logic states at inputs pch2 and pch1 at Vcce or at a reference voltage that is lower than Vss.

The stress may be applied, for example, to alter a characteristic of inverting input driver 810-2 and/or 810-1 relative to one another, and/or to alter a characteristic of input device N6 and/or N3 relative to one another. The characteristic may include a voltage threshold and/or other characteristic(s).

After first IC block 802 is stress-programmed, the first block program parameters may be removed or discontinued, and Vcce may be removed and/or reduced to Vcc.

After stress-programming, first IC block 802 may remain operable to assert complimentary logic states at outputs 716 based on complementary logic states at inputs pch2 and pch1, and may be reset with Itchclk to assert or expose the stress-programmed pre-determined logic states at outputs 716.

In FIGS. 7 and 8, buffer circuitry 704 and latch circuitry 706 are asynchronous, in that they propagate complementary states as they are received, without clock control and/or registers.

In FIGS. 7 and 8, buffer circuitry 704 and latch circuitry 706 propagate complementary logic states without addressing and without read and or write controls.

An IC system may include multiple instances of stress-programmable circuitry, configurable to assert a pre-determined word, such as described below with reference to FIG. 9 and/or FIG. 10.

Figure 9:
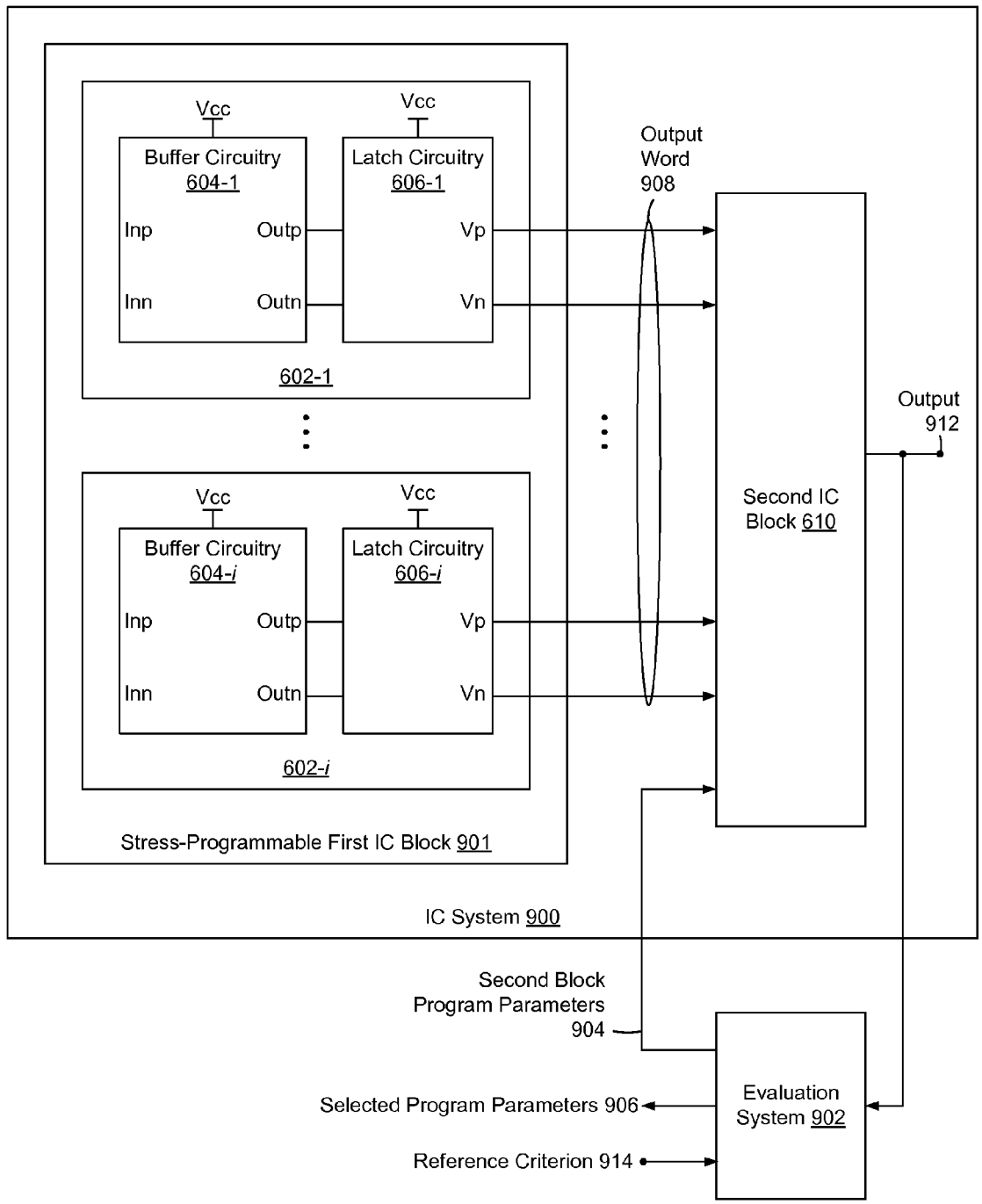
FIG. 9 is a block diagram of an IC system and an evaluation system, where the IC system includes multiple instances of the stress-programmable IC block of FIG. 6.

FIG. 9 is a block diagram of an IC system 900 and an evaluation system 902.

IC system 900 includes a stress-programmable first IC block 901, including multiple instances of first IC block 602, each to provide a corresponding bit of an output word 908 to second IC block 610.

IC system 900 may be configured to provide complementary outputs Vp and Vn, from each latch 602, to second IC block 610. Alternatively, IC system 900 may be configured to provide one of outputs Vp and Vn from each latch 602 to second IC block 610.

Evaluation system 902 is configured to program or configure second IC block 610 with second block program parameters 904, evaluate a corresponding parameter measure at an output 912, and select program parameters 906 for which the output parameter measure satisfies a reference criterion 914. Evaluation system 902 may represent an example embodiment of evaluation system 500 in FIG. 5.

IC system 900 may include an internal bus, and second IC block 610 may be programmable over the internal bus, such as described above with respect to internal bus 518 in FIG. 5.

Figure 10:
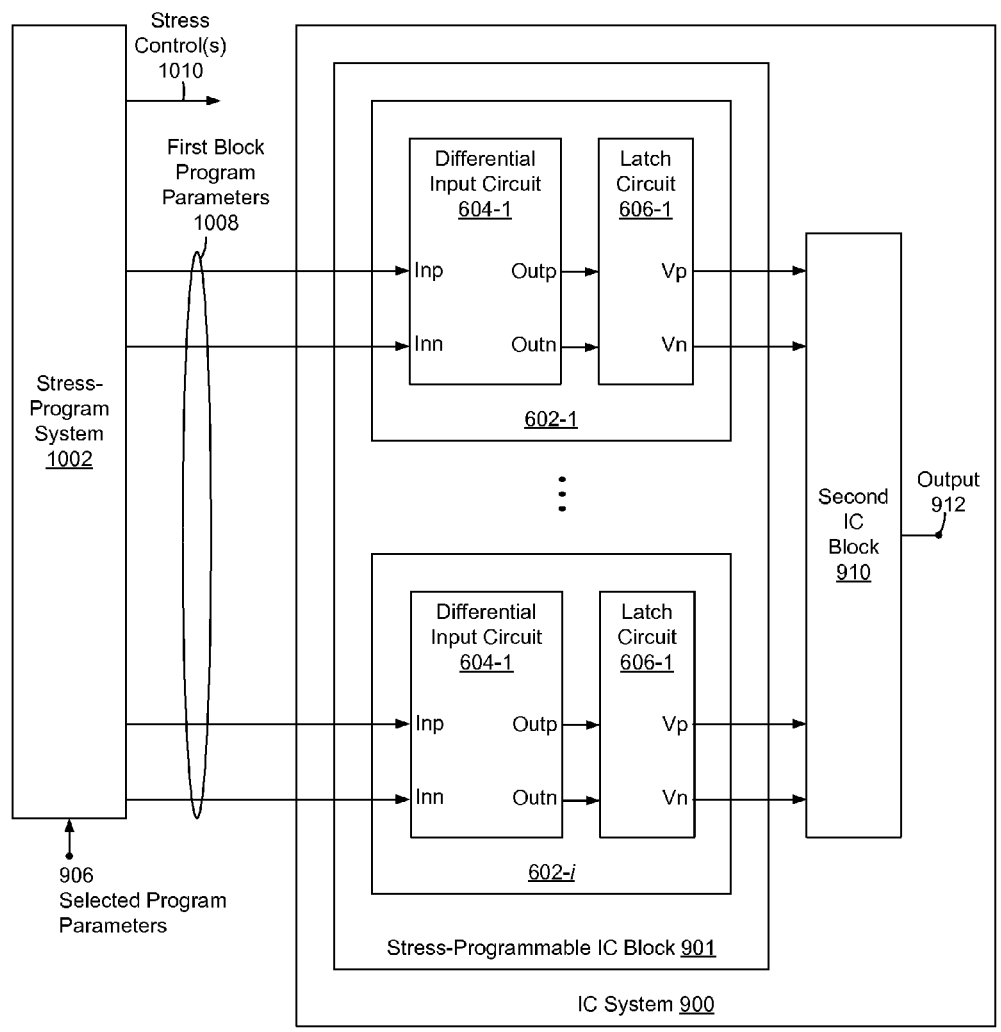
FIG. 10 is a block diagram of the IC system of FIG. 9, and a stress-program system.

FIG. 10 is a block diagram of IC system 900 of FIG. 9, and a stress-program system 1002 to stress-program IC blocks 602 based on selected program parameters 906.

Stress-program system 1002 is configured to program or configure IC blocks 602, each with a corresponding set of first block program parameters 1008. Stress-program system 1002 may be configured to generate or select first block program parameters 1008 based on selected program parameters 906, such as described in one or more examples herein.

Stress-program system 1002 is further configured to apply and/or control a stress condition to IC system 900, or a portion thereof, with stress control(s) 1010, to alter a characteristic of IC blocks 602 such as described in one or more examples herein. Stress-program system 1002 may represent an example embodiment of stress-program system 200 in FIG. 2.

Figure 12:
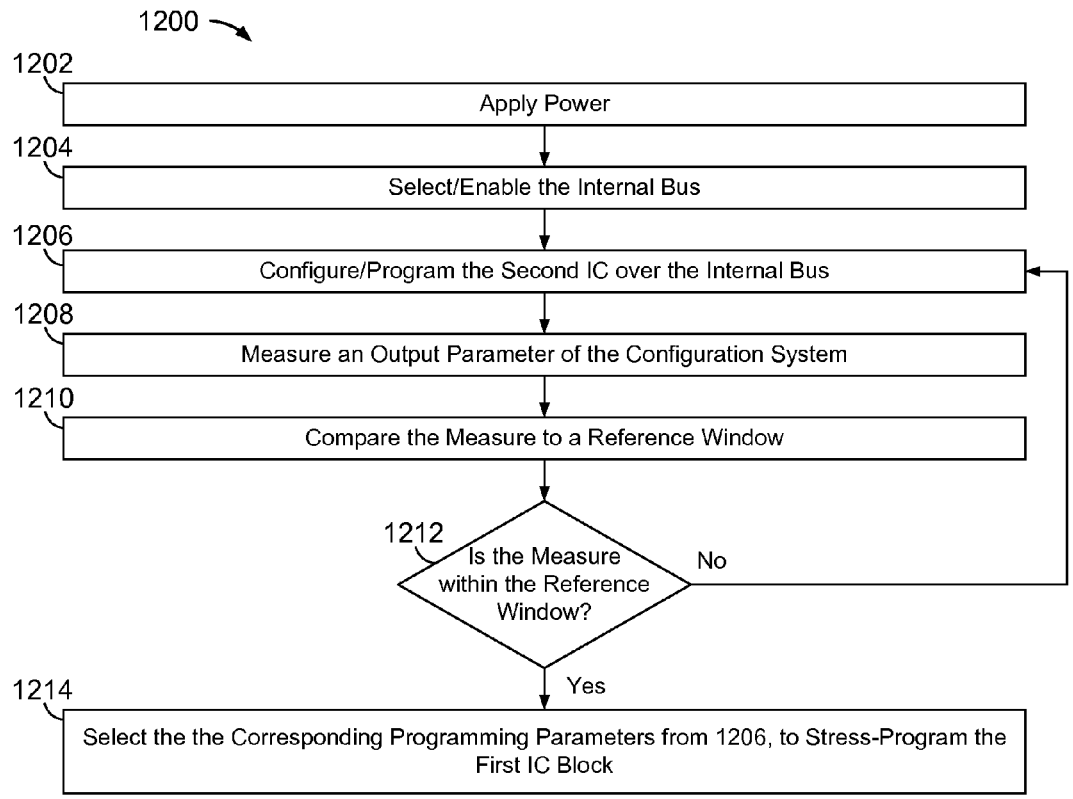
FIG. 12 is a flowchart of a method of programming and evaluating a second IC block to select program parameters with which to program a first IC block.
Figure 13:
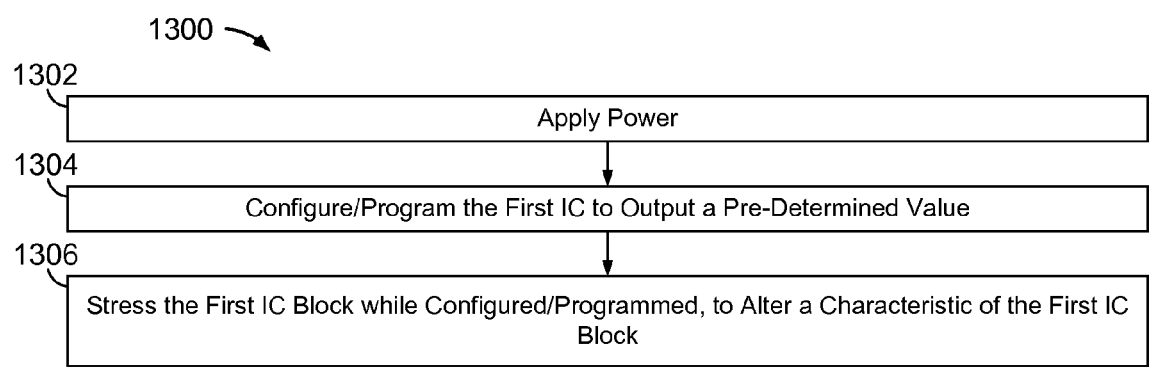
FIG. 13 is a flowchart of a method to stress-program an IC block.
Figure 14:
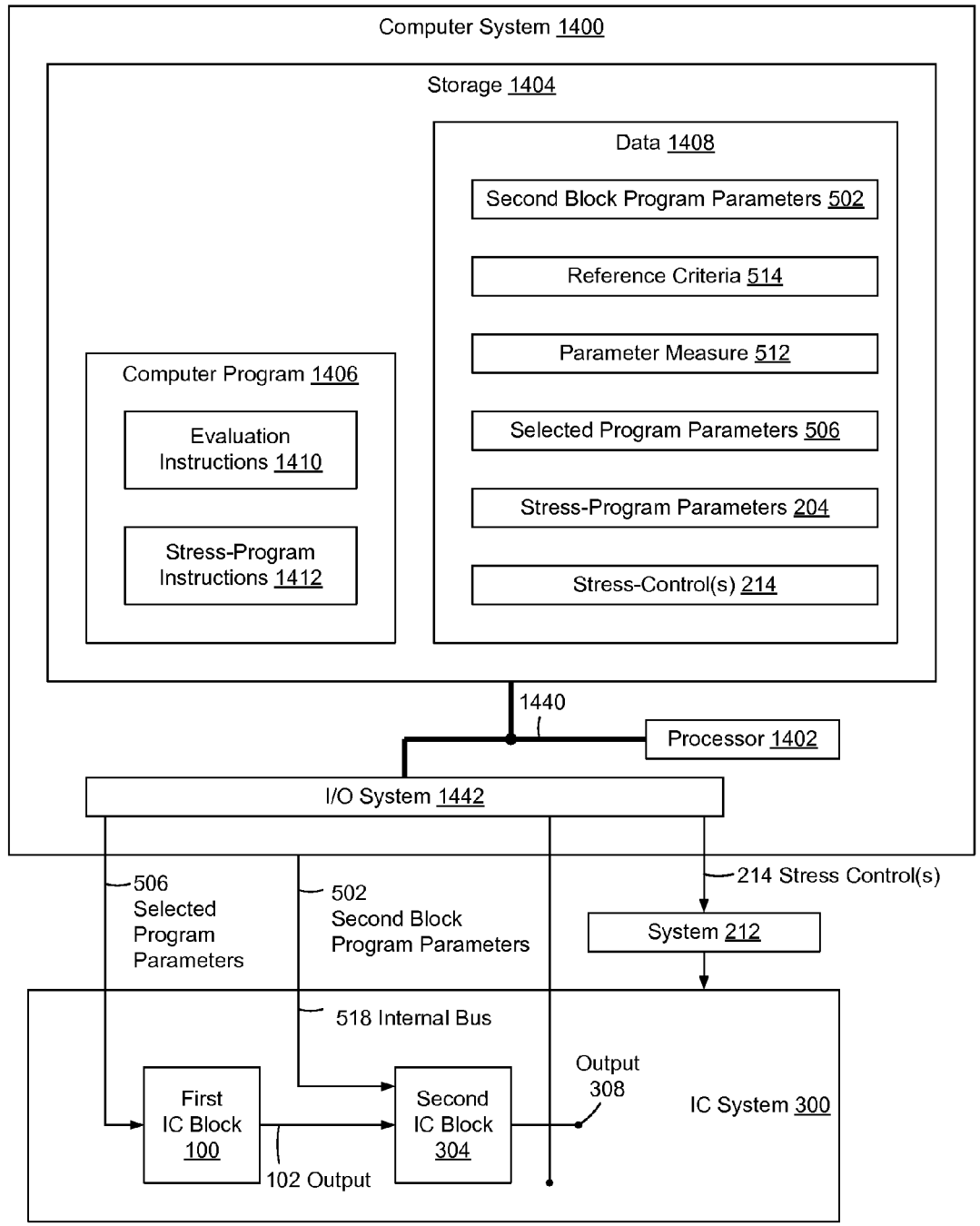
FIG. 14 is a block diagram of a computer system configured to evaluate and stress-program an IC system.

Example methods to stress-program an IC system are disclosed below with reference to FIGS. 12, 13, and 14. The methods of FIGS. 12, 13, and 14 are described below with reference to an IC system that includes a stress-programmable first IC block, and a second IC block to receive a stress-programmed pre-determined value from the first IC block, such as described in one or more examples herein.

The IC system may further include an internal bus to program the second IC block during an evaluation and/or during operation. The IC system may be configurable to provide an output of the first IC block to the second IC block, and/or to provide a default value to the second IC block over the internal bus. The internal bus may be disabled or de-selected by default to provide the output of the first IC block to the second IC block by default. Status of the internal bus may be maintained in a non-volatile device.

Methods disclosed below are not, however, limited to the example IC system described above.

Figure 11:
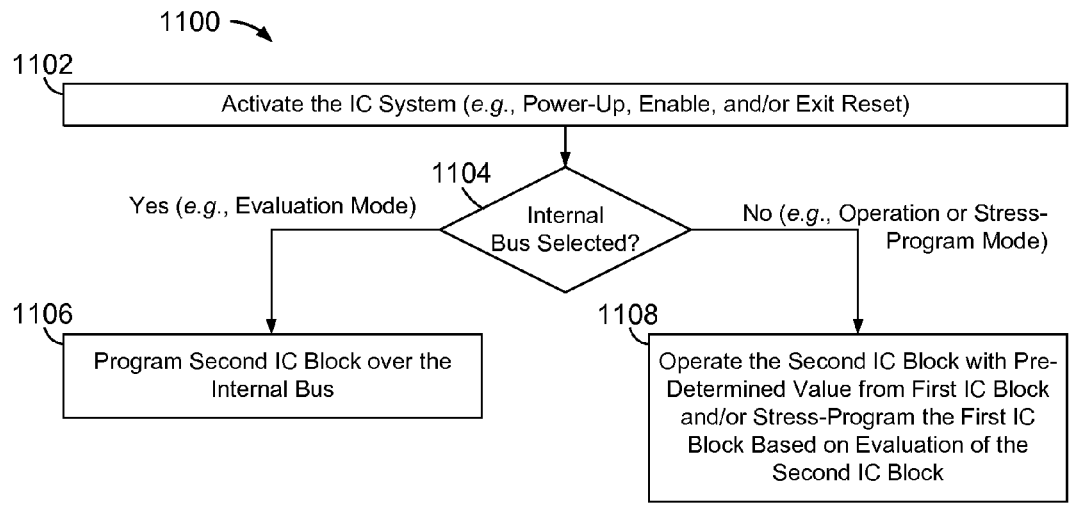
FIG. 11 is a flowchart of a method of selectively configuring an IC system to evaluate, operate, and/or stress-program the IC system.

FIG. 11 is a flowchart of a method 1100 of selectively configuring an IC system to evaluate, operate, and/or stress-program the IC system.

At 1102, the IC system is activated.

At 1104, status of an internal bus of the IC system may be examined and/or set.

If the internal bus is selected or enabled at 1104, processing proceeds to 1106 where the second IC block is programmed with second block program parameters over the internal bus. The second IC block may be evaluated based on the second block program parameters, such as described below with reference to FIG. 12.

If the internal bus is de-selected or disabled at 1104, processing proceeds to 1108. At 1108, the second IC block may be provided with a pre-determined value from the first IC block. This may correspond to an operation mode. Alternatively, the first IC block may be stress-programmed to assert a pre-determined value based on the evaluation at 1104. The first IC block may be stress-programmed as descried below with reference to FIG. 13.

FIG. 12 is a flowchart of a method 1200 of programming and evaluating an IC block to select program parameters that cause the IC block to provide a desired output. The selected program parameters may be used to stress-program another IC block, such as described below with reference to FIG. 13. Method 1200 is described with reference to the second IC block of the example IC system described further above.

At 1202, power is applied to at least the second IC block.

At 1204, an internal bus of the IC system is selected or enabled.

At 1206, the second IC block is configured or programmed over the internal bus with second block programming parameters, such as described in one or more examples herein.

At 1208, an output parameter of the second IC block is measured.

At 1210, the measure is evaluated with respect to a reference criterion, such as described in one or more examples herein.

At 1212, if the measure is does not satisfy the reference criterion, processing returns to 1206 to re-program the second IC block.

When the output parameter measure satisfies the reference criterion at 1212, the corresponding second block program parameters applied at 1206 are selected at 1214. The selected program parameters may be recorded and/or provided to a stress-program system to program a first IC block, such as described below with reference to FIG. 13.

FIG. 13 is a flowchart of a method 1300 to stress-program an IC block. Method 1300 is described below with reference to the first IC block of the example IC system described further above.

At 1302, power is applied to at least the first IC block.

The internal bus may be disabled or de-selected by control or by default.

At 1304, the first IC block is configured or programmed to output a pre-determined value. The first IC block may be programmed with first block program parameters that are based on the program parameters selected at 1214 in FIG. 12. The first block program parameters may be configured or selected to cause the first IC block to output the program parameters selected at 1214 in FIG. 12, as the pre-determined value. The program parameters selected at 1214 in FIG. 12 may be accessed or read from memory or a storage device.

Configuring or programming at 1304 may be referred to herein as configuring, biasing, and/or setting time-zero fuse programming inputs of the first IC block.

At 1306, a stress-condition is applied to the first IC block, or a portion thereof, while the first IC block is programmed, to alter a characteristic of the first IC block, such as described in one or more examples herein.

After stress-programming, the IC system may be operated to assert the pre-determined value upon activation.

Stress-programming, as disclosed herein, may include applying a stress condition based on a stress pattern, which may be defined by and/or configurable with respect to duration, magnitude, and/or time-based magnitude variations (e.g., ramp-up, ramp-down, and/or cycle). Time-based stress magnitude variations may be linear and/or step-wise.

Multiple stress conditions may be applied to an IC block in accordance with similar and/or dissimilar stress patterns.

A stress pattern may be selected and/or configured to alter a characteristic of an IC block to an extent to cause an IC block to assert a pre-determined value upon activation and absent program parameters.

A stress pattern may be selected and/or configured based on one or more of a variety of factors, which may include, without limitation, stress condition (e.g., voltage or temperature), characteristic(s) to be altered, manufacturing factors (e.g., materials and/or process scale), IC factors (e.g., devices, layout, and/or size/area/volume, and/or other factors), and/or environmental/intended-use factors/considerations.

A stress pattern may be selected and/or configured based, at least in part, on IC design, simulation, and/or experiment (e.g., trial and error).

An evaluation system and/or a stress-programming system, as disclosed herein, may be implemented in circuitry and/or a machine, such as a computer system, and combinations thereof, including discrete and integrated circuitry, application specific integrated circuitry (ASIC), and/or a combination of a processor and memory, and may be implemented as part of a domain-specific integrated circuit package or system-on-a-chip (SOC), and/or a combination of integrated circuit packages.

FIG. 14 is a block diagram of a computer system 1400, configured to evaluate and stress-program an IC system. Computer system 1400 is described below with reference to IC system 300, and with respect to evaluation features described above with respect to FIG. 5, and stress-program features described above with respect to FIG. 2. Computer system 1400 is not, however, limited to the examples of FIG. 2, FIG. 3, or FIG. 5. Computer system 1400 may implemented as part of an HVM test system, and/or may be configured to operate in conjunction with an HVM test system.

Computer system 1400 includes one or more computer instruction processor units and/or processor cores, illustrated here as a processor 1402, to execute instructions of a computer program 1406. Processor 1402 may include a general purpose instruction processor, a controller, a microcontroller, or other instruction-based processor. Computer program 1406, also referred to as computer program logic or software, may be encoded within a computer readable medium, which may include a non-transitory medium.

Computer system 1400 further includes storage 1404, which may include one or more types of storage described below with reference to FIG. 15.

Figure 15:
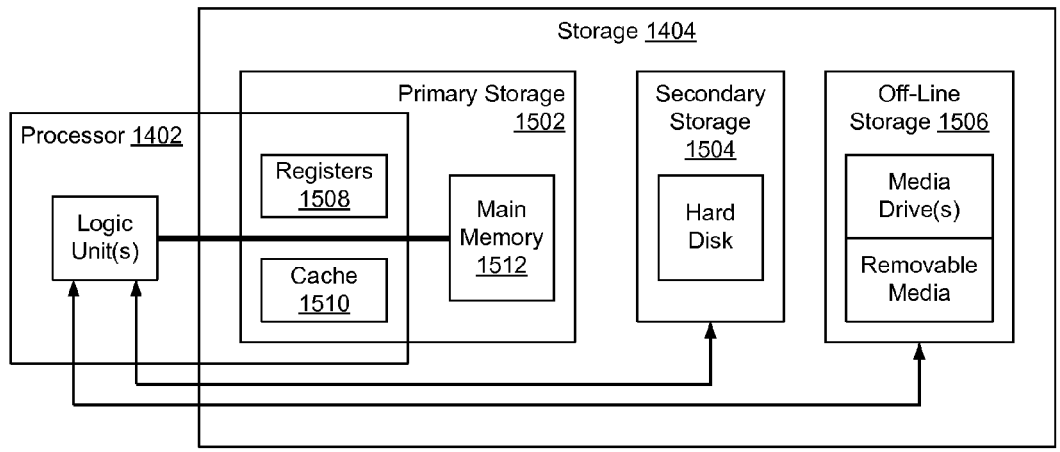
FIG. 15 is a block diagram of example memory/storage features of the computer system of FIG. 14.

FIG. 15 is a block diagram of processor 1402 and storage 1404, where storage 1404 includes primary storage 1502, secondary storage 1504, and off-line storage 1506.

Primary storage 1502 includes registers 1508, processor cache 1510, and main memory or system memory 1506. Registers 1508 and cache 1510 may be directly accessible by processor 1402. Main memory 1506 may be accessible to processor 1402 directly and/or indirectly through a memory bus. Primary storage 1502 may include volatile memory such as random-access memory (RAM) and variations thereof including, without limitation, static RAM (SRAM) and/or dynamic RAM (DRAM).

Secondary storage 1504 may be indirectly accessible to processor 1402 through an input/output (I/O) channel, and may include non-volatile memory such as read-only memory (ROM) and variations thereof including, without limitation, programmable ROM (PROM), erasable PROM (EPROM), and electrically erasable PROM (EEPROM). Non-volatile memory may also include non-volatile RAM (NVRAM) such as flash memory. Secondary storage 1504 may be configured as a mass storage device, such as a hard disk or hard drive, a flash memory drive, stick, or key, a floppy disk, and/or a zip drive.

Off-line storage 1506 may include a physical device driver and an associated removable storage medium, such as an optical disc.

In FIG. 14, storage 1404 includes data 1408 to be used by processor 1402 during execution of computer program 1406, and/or generated by processor 1402 during execution of computer program 1406.

In the example of FIG. 14, computer program 1406 includes evaluation instructions 1410 to cause processor 1402 to program or configure second IC block 304 with second block program parameters 502, compare a parameter measure 512 of a corresponding output of second IC block 304, and select set of second block program parameters 506 for which a corresponding parameter measure 512 satisfies or meets reference criterion 514, such as described in one or more examples herein.

Computer program 1406 further includes stress-program instructions 1412 to cause processor 1402 to configure or program first IC block 100 based on selected program parameters 506, and to control a system 212 to apply a stress condition to at least a portion of first IC block 100 to alter a features and/or characteristic of first IC block 100, such as described in one or more examples herein.

Stress-program instructions 1412 may include instructions to cause processor 1402 to generate first block program parameters 204 based on selected program parameters 506, and to program first IC block with first block program parameters 204, such as described in one or more examples herein.

Computer system 1400 further includes communications infrastructure 1440 to communicate amongst devices and/or resources of computer system 1400.

Computer system 1400 further includes an input/output (I/O) system 1442 to interface with one or more other systems, such as IC system 300 and system 212.

Methods and systems disclosed herein may be implemented with respect to one or more of a variety of systems, such as described below with reference to FIG. 16. Methods and systems disclosed herein are not, however, limited to the examples of FIG. 16.

Figure 16:
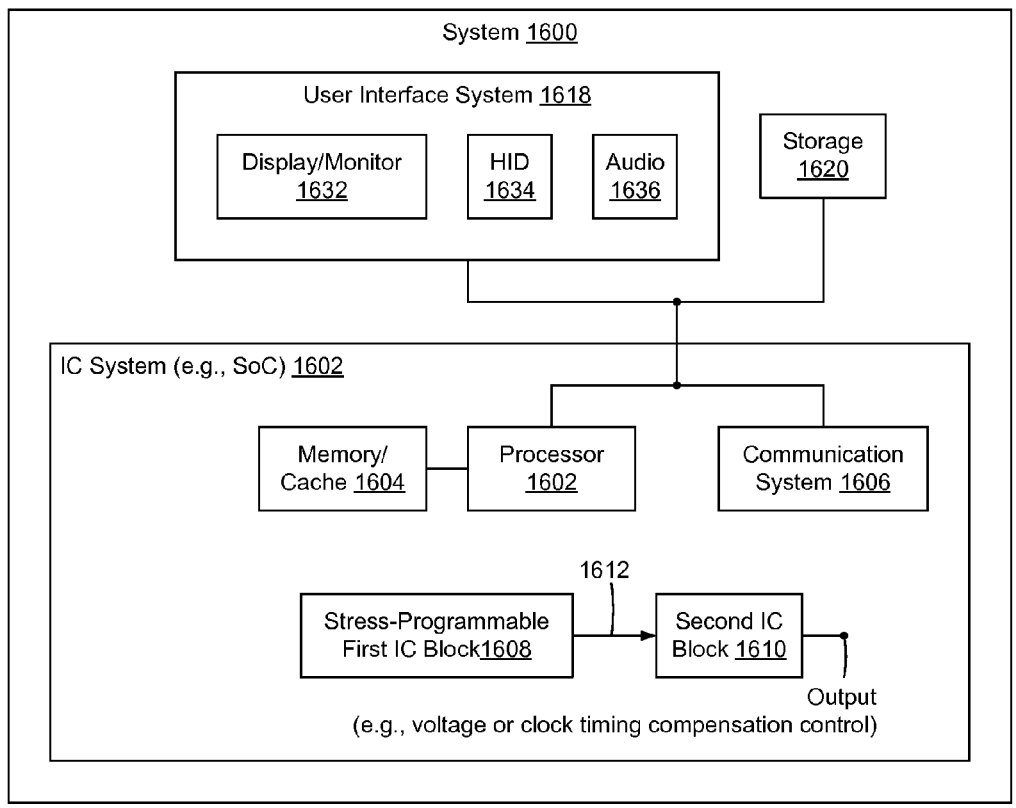
FIG. 16 is a block diagram of a system that includes a processor and memory, a communication system, a user interface system, and a stress-programmable IC system.

FIG. 16 is a block diagram of a system 1600, including a stress-programmable IC system 1602 and a user interface system 1618.

IC system 1602 includes a processor 1602, memory, cache, and/or other on-chip storage (memory) 1604, and a communication system 1606.

IC system 1602 further includes a stress-programmable first IC block 1608 to provide a pre-determined value 1612 at time-zero to a second IC block 1610, such as described in one or more examples herein. Second IC block 1610 may include, for example, circuitry to compensate for process corner variations and/or random variations within IC system 1602.

User interface system 1618 may include a monitor or display 1632 and/or a human interface device (HID) 1634. HID 1634 may include, without limitation, a key board, a cursor device, a touch-sensitive device, a motion and/or image sensor, a physical device and/or a virtual device, such as a monitor-displayed virtual keyboard. User interface system 1618 may include an audio system 1636, which may include a microphone and/or a speaker.

Communication system 1606 may include a wired and/or wireless communication system. Communication system 1606 may be configured to communicate between system 1600 and one or more other systems over an external network, such as a voice and/or data network device. Communication system 1606 may be configured to wirelessly communicate with an inter-chip and/or intra-chip communication network.

In FIG. 16, memory 1604 is accessible to processor 1602, and may be accessible communication system 1606 and/or user interface system 1618. System 1600 may include additional memory and/or a storage device 1620, which may be accessible to user interface system 1618 and/or IC system 1602. Memory 1604 and/or other storage 1620 may include one or more features described above with respect to FIG. 15.

System 1600 may be configured as a stationary or portable/hand-held system, and may be configured as a mobile telephone, a set-top box, and/or a rack-mountable, desk-top, laptop, notebook, net-book, note-pad, tablet, and/or other conventional and/or future-developed system(s). System 1600 is not, however, limited to these examples.

Further to the description above, an apparatus may include a first integrated circuit block to assert complementary logic states at outputs of the first IC block based on complementary logic states at inputs of the first IC block, where the first IC block is stressed while complimentary logic states are applied to the inputs, to program the first IC block to assert pre-determined complementary logic states at the outputs upon de-activation of a reset control without assertion of the complementary logic states at the inputs.

The programmed first IC block may remain operable to assert complementary logic states at the outputs when complementary logic states are asserted at the inputs.

The first IC block may be configured to assert the pre-determined complementary logic states at the outputs when the reset control is de-activated and the inputs are at a same voltage.

The first IC block may include buffer circuitry to assert complementary logic states at outputs of the buffer circuitry based on complementary logic states at the inputs of the first IC block, and latch circuitry to latch the complementary logic states at the outputs of the buffer circuitry and assert the latched complementary logic states at the outputs of the first IC block, where at least a portion of the buffer circuitry is stressed to program the buffer circuitry to assert the pre-determined complementary logic states at the outputs of the buffer circuitry upon de-activation of the reset control.

The buffer circuitry and the latch circuitry may be asynchronous.

The first IC block may include first and second complementary circuit paths, and reset circuitry to apply a reset voltage to complementary nodes of first and second complementary circuit paths when the reset control is active.

The first IC block may be configured or implemented as a configuration register to provide at least one of the pre-determined complementary logic states as a programmed configuration register value upon de-activation of the reset control.

The first IC block and a second IC block may be on a same IC die, and the IC die may be configurable to provide the second IC block with a selectable one of the programmed configuration register value from the first IC block and a default configuration register value.

The first IC block and a second IC block may be on a same IC die, and the second IC block may be configured to receive at least one of the pre-determined complementary logic states from the first IC block as a pre-determined compensation value to compensate for one or more of process corner variations and random variations imparted by one or more IC blocks of the IC die.

The IC die may include an internal bus to configure the second IC block during an evaluation, and the pre-determined value may be based on the evaluation.

The IC die may be configured to provide an updated compensation value to the second IC block over the internal bus after the pre-determined compensation value is provided to the second IC block.

Further to the description above, a method may include asserting complementary logic states at inputs of a first integrated circuit (IC) block to cause the first IC block to assert pre-determined complementary logic states at outputs of the first IC block, and stressing at least a portion of the first IC block while the complementary logic states are asserted at the inputs, to program the first IC block to assert the pre-determined complementary logic states upon de-activation of a reset control without assertion of the complementary logic states at the inputs.

The method may further include configuring the first IC block to assert the pre-determined complementary logic states at the outputs when the reset control is de-activated and the inputs are at a same voltage.

The first IC block may include buffer circuitry to assert complementary logic states at outputs of the buffer circuitry based on complementary logic states at the inputs of the first IC block, and latch circuitry to latch the complementary logic states at the outputs of the buffer circuitry and assert the latched complementary logic states at the outputs of the first IC block, and the stressing may include stressing at least a portion of the buffer circuitry to program the buffer circuitry to assert the pre-determined complementary logic states at the outputs of the buffer circuitry upon de-activation of the reset control.

The method may include configuring the first IC block as a configuration register to provide at least one of the pre-determined complementary logic states as a programmed configuration register value upon de-activation of the reset control.

The first IC block and a second IC block may be on a same IC die, and the method may include configuring the IC die to provide the second IC block with a selectable one of the programmed configuration register value from the first IC block, and a default configuration register value.

The first IC block and a second IC block may be on a same IC die, and the method may include configuring the first IC block to provide at least one of the pre-determined logic states to a second IC block as a pre-determined compensation value to compensate for one or more of process corner variations and random variations imparted by one or more IC blocks of the IC die.

The IC die may include an internal bus, and the method may include configuring the second IC block over the internal bus, evaluating a corresponding output parameter of the second IC block, and selecting the pre-determined value based on the evaluating.

The method may include configuring the IC die to provide an updated compensation value to the second IC block over the internal bus after the pre-determined compensation value is provided to the second IC block.

Further to the description above, a system, machine, and/or computer system may be configured to implement one or more features described above with respect to a method.

Further to the description above, a non-transitory computer readable medium may be encoded with a computer program, including instructions to cause a processor to provide complementary logic states to inputs of a first IC block to cause the first IC block to assert pre-determined complementary logic states at outputs of the first IC block, and to cause the processor to control a system to stress at least a portion of the first IC block while the complementary logic states are asserted at the inputs, to program the first IC block to assert the pre-determined complementary logic states at the outputs upon de-activation of a reset control without assertion of the complementary logic states at the inputs.

The first IC block may include buffer circuitry to assert complementary logic states at outputs of the buffer circuitry based on complementary logic states at the inputs of the first IC block, and latch circuitry to latch the outputs of the buffer circuitry and assert the latched outputs at the outputs of the first IC block, and the computer readable medium may include instructions to cause the processor to control the system to stress at least a portion of the buffer circuitry to cause the buffer circuitry to assert the pre-determined complementary logic states at the outputs of the buffer circuitry upon de-activation of the reset control.

The first IC block and a second IC block may be on a same IC die, and the computer readable medium may include instructions to cause the processor to configure the IC die to provide the second IC block with a selectable one of the programmed configuration register value from the first IC block, and a default configuration register value.

The first IC block and a second IC block may be on a same IC die, and the computer readable medium may include instructions to cause the processor to configure the first IC block to provide at least one of the pre-determined complementary logic states to the second IC block as a pre-determined compensation value to compensate for one or more of process corner variations and random variations imparted by one or more IC blocks of the IC die.

The IC die may include an internal bus, and the computer readable medium may include instructions to cause the processor to configure the second IC block over the internal bus, evaluate a corresponding output parameter of the second IC block, and select the pre-determined value based on the evaluating.

Further to the description above, a machine readable storage medium may include program code, when executed, to cause a machine to implement one or more features described above with respect to a method and/or a computer readable medium.

Further to the description above, a system may include an IC die having a processor, memory, and compensation circuitry, including a stress-programmable configuration register to assert a pre-determined configuration register value following a reset to compensate for one or more of process corner variations and random variations imparted by one or more IC blocks of the IC die.

The system may further include a user interface and a communication system to communicate between another communication system and one or more of the processor and the user interface. The communication system may be configured to communicate with at least one of a wireless voice network and a wireless packet-based network, and the system may be configured as a battery powered portable device.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed. While various embodiments are disclosed herein, it should be understood that they are presented as examples. The scope of the claims should not be limited by any of the example embodiments disclosed herein.

What is claimed is:

1. An apparatus, comprising:
 a first integrated circuit block to assert complementary logic states at outputs of the first IC block based on complementary logic states at inputs of the first IC block;
 wherein the first IC block is stressed while complementary logic states are applied to the inputs, to program the first IC block to assert pre-determined complementary logic states at the outputs upon de-activation of a reset control without assertion of the complementary logic states at the inputs.

2. The apparatus of claim 1, wherein the programmed first IC block is operable to assert complementary logic states at the outputs when complementary logic states are asserted at the inputs.

3. The apparatus of claim 1, wherein the first IC block is configured to assert the pre-determined complementary logic states at the outputs when the reset control is de-activated and the inputs are at a same voltage.

4. The apparatus of claim 1, wherein the first IC block includes:
 buffer circuitry to assert complementary logic states at outputs of the buffer circuitry based on complementary logic states at the inputs of the first IC block; and
 latch circuitry to latch the complementary logic states at the outputs of the buffer circuitry and assert the latched complementary logic states at the outputs of the first IC block;
 wherein at least a portion of the buffer circuitry is stressed to program the buffer circuitry to assert the pre-determined complementary logic states at the outputs of the buffer circuitry upon de-activation of the reset control.

5. The apparatus of claim 4, wherein the buffer circuitry and the latch circuitry are asynchronous.

6. The apparatus of claim 1, wherein the first IC block includes:
 first and second complementary circuit paths; and
 reset circuitry to apply a reset voltage to complementary nodes of first and second complementary circuit paths when the reset control is active.

7. The apparatus of claim 1, wherein the first IC block is configured as a configuration register to provide at least one of the pre-determined complementary logic states as a programmed configuration register value upon de-activation of the reset control.

8. The apparatus of claim 7, wherein:
 the first IC block and a second IC block are on a same IC die; and
 the IC die is configurable to provide the second IC block with a selectable one of the programmed configuration register value from the first IC block and a default configuration register value.

9. The apparatus of claim 1, wherein:
 the first IC block and a second IC block are on a same IC die; and
 the second IC block is configured to receive at least one of the pre-determined complementary logic states from the first IC block as a pre-determined compensation value to compensate for one or more of process corner variations and random variations imparted by one or more IC blocks of the IC die.

10. The apparatus of claim 9, wherein the IC die further includes an internal bus to configure the second IC block during an evaluation, and wherein the pre-determined value is based on the evaluation.

11. The apparatus of claim 10, wherein the IC die is configured to provide an updated compensation value to the second IC block over the internal bus after the pre-determined compensation value is provided to the second IC block.

12. A method, comprising:
asserting complementary logic states at inputs of a first integrated circuit (IC) block to cause the first IC block to assert pre-determined complementary logic states at outputs of the first IC block; and
stressing at least a portion of the first IC block while the complementary logic states are asserted at the inputs, to program the first IC block to assert the pre-determined complementary logic states upon de-activation of a reset control without assertion of the complementary logic states at the inputs.

13. The method of claim 12, further including:
configuring the first IC block to assert the pre-determined complementary logic states at the outputs when the reset control is de-activated and the inputs are at a same voltage.

14. The method of claim 12, wherein:
the first IC block includes buffer circuitry to assert complementary logic states at outputs of the buffer circuitry based on complementary logic states at the inputs of the first IC block;
the first IC block further include latch circuitry to latch the complementary logic states at the outputs of the buffer circuitry and assert the latched complementary logic states at the outputs of the first IC block; and
the stressing includes stressing at least a portion of the buffer circuitry to program the buffer circuitry to assert the pre-determined complementary logic states at the outputs of the buffer circuitry upon de-activation of the reset control.

15. The method of claim 12, further including:
configuring the first IC block as a configuration register to provide at least one of the pre-determined complementary logic states as a programmed configuration register value upon de-activation of the reset control.

16. The method of claim 15, wherein the first IC block and a second IC block are on a same IC die, the method further including:
configuring the IC die to provide the second IC block with a selectable one of the programmed configuration register value from the first IC block, and a default configuration register value.

17. The method of claim 12, wherein the first IC block and a second IC block are on a same IC die, the method further including:
configuring the first IC block to provide at least one of the pre-determined logic states to a second IC block as a pre-determined compensation value to compensate for one or more of process corner variations and random variations imparted by one or more IC blocks of the IC die.

18. The method of claim 17, wherein the IC die includes an internal bus, the method further including:
configuring the second IC block over the internal bus, evaluating a corresponding output parameter of the second IC block, and selecting the pre-determined value based on the evaluating.

19. The method of claim 18, further including:
configuring the IC die to provide an updated compensation value to the second IC block over the internal bus after the pre-determined compensation value is provided to the second IC block.

20. A non-transitory computer readable medium encoded with a computer program, including instructions to cause a processor to:
provide complementary logic states to inputs of a first integrated circuit (IC) block to cause the first IC block to assert pre-determined complementary logic states at outputs of the first IC block; and
control a system to stress at least a portion of the first IC block while the complementary logic states are asserted at the inputs, to program the first IC block to assert the pre-determined complementary logic states at the outputs upon de-activation of a reset control without assertion of the complementary logic states at the inputs.

21. The non-transitory computer readable medium of claim 20, wherein the first IC block includes buffer circuitry to assert complementary logic states at outputs of the buffer circuitry based on complementary logic states at the inputs of the first IC block, and latch circuitry to latch the outputs of the buffer circuitry and assert the latched outputs at the outputs of the first IC block, and wherein the computer readable medium further includes instructions to cause the processor to:
control the system to stress at least a portion of the buffer circuitry to cause the buffer circuitry to assert the pre-determined complementary logic states at the outputs of the buffer circuitry upon de-activation of the reset control.

22. The non-transitory computer readable medium of claim 20, wherein the first IC block and a second IC block are on a same IC die, and wherein the computer readable medium further includes instructions to cause the processor to:
configure the IC die to provide the second IC block with a selectable one of the programmed configuration register value from the first IC block, and a default configuration register value.

23. The non-transitory computer readable medium of claim 20, wherein the first IC block and a second IC block are on a same IC die, and wherein the computer readable medium further includes instructions to cause the processor to:
configure the first IC block to provide at least one of the pre-determined complementary logic states to the second IC block as a pre-determined compensation value to compensate for one or more of process corner variations and random variations imparted by one or more IC blocks of the IC die.

24. The non-transitory computer readable medium of claim 23, wherein the IC die further includes an internal bus, and wherein the computer readable medium further includes instructions to cause the processor to:
configure the second IC block over the internal bus, evaluate a corresponding output parameter of the second IC block, and select the pre-determined value based on the evaluating.

25. A system, comprising an integrated circuit (IC) die, including:
a processor and memory; and
compensation circuitry, to compensate for one or more of process corner variations and random variations imparted during manufacture of the IC die, based on a multiple-bit control word; and
metastable integrated circuitry to a output a random multiple-bit word when power is applied to the metastable integrated circuitry, wherein the metastable integrated circuitry is stress-programmable with one or more of voltage stress and temperature stress to transform the metastable integrated circuitry to stress-programmed integrated circuitry output a pre-determined multiple-bit control word to the compensation circuitry when power is applied to the stress-programmed integrated circuitry.

26. The system of claim 25, further including:
a user interface; and
a communication system to communicate between another communication system and one or more of the processor and the user interface.

27. The system of claim 26, wherein the communication system is configured to communicate with at least one of a wireless voice network and a wireless packet-based network.

28. The system of claim 27, configured as a battery powered portable device.

\* \* \* \* \*